United States Patent [19]

Diba

[11] Patent Number: 5,498,989
[45] Date of Patent: Mar. 12, 1996

[54] INTEGRATED CIRCUIT ONE SHOT WITH EXTENDED LENGTH OUTPUT PULSE

[75] Inventor: Sholeh Diba, San Jose, Calif.

[73] Assignee: Xilinx, Inc., San Jose, Calif.

[21] Appl. No.: 230,045

[22] Filed: Apr. 19, 1994

[51] Int. Cl.$^6$ ............................ H03K 3/033; H03K 3/355
[52] U.S. Cl. ............................ 327/230; 327/142; 327/198
[58] Field of Search ............................ 327/227, 230, 327/143, 142, 198

[56] References Cited

U.S. PATENT DOCUMENTS

| | | | |
|---|---|---|---|
| 4,507,570 | 3/1985 | Mahabadi et al. | 327/227 |
| 4,629,908 | 12/1986 | Ethe et al. | 327/227 |
| 4,928,023 | 5/1990 | Marshall | 326/87 |
| 5,113,098 | 5/1992 | Teymouri | 327/581 |
| 5,151,614 | 9/1992 | Yamazaki et al. | 327/143 |
| 5,177,375 | 1/1993 | Ogawa et al. | 327/143 |
| 5,265,064 | 11/1993 | Davies et al. | 327/172 |
| 5,298,799 | 3/1994 | Cochran et al. | 327/227 |
| 5,338,978 | 8/1994 | Larsen et al. | 327/333 |

*Primary Examiner*—Timothy P. Callahan
*Assistant Examiner*—Terry L. Englund
*Attorney, Agent, or Firm*—Edel M. Young; Norman R. Klivans

[57] ABSTRACT

An integrated circuit one shot circuit provides relatively long duration (hundreds of nanoseconds up to a millisecond) output pulses without the need for excessively large transistors. The one shot circuit includes a pull up and a pull down device connected to the one shot circuit's input terminal, with a latch connected to a node between the pull up and pull down devices. The output terminal of the latch is connected to the input of a Schmitt trigger. One terminal of a grounded capacitor is connected between the latch output terminal and the Schmitt trigger input. The output terminal of the Schmitt trigger is connected through an inverter to one input terminal of a NAND gate, the other input terminal of which is connected to the one shot circuit's input terminal. A feedback line connects the output terminal of the NAND gate to the gate of a depletion mode transistor which is between the pull up and pull down devices. This provides a glitch free long duration output pulse using conventional CMOS transistor fabrication technology in a large scale integrated circuit.

13 Claims, 2 Drawing Sheets

INTEGRATED CIRCUIT ONE SHOT WITH EXTENDED LENGTH OUTPUT PULSE

RELATED PATENT APPLICATION

This application relates to copending and commonly owned U.S. patent application, Ser. No. 08/229,977, invented by Sholeh Diba entitled "Low Noise Margin Schmitt Trigger with Controllable Trip Point", incorporated by reference.

BACKGROUND OF THE INVENTION

1. Field of the Invention

This invention relates to a one shot circuit and more specifically to a one shot circuit having an extended output pulse length.

2. Description of the Prior Art

One shot circuits are well known in electronics. A one shot circuit ("one shot") delivers one output pulse for each input (trigger) pulse. The output pulse is a signal of a predetermined length (i.e., having a particular amplitude for a predetermined time) whereas the input pulse is typically a single upwards or downwards signal transition. These one shot circuits have wide application.

A typical prior art integrated circuit one shot circuit is shown in FIG. 1 and includes an input terminal 10 and input inverter 12. Three inverters 14, 16, 18 are connected serially to a first input terminal of a NOR gate 20. The combination of the delay provided by the three inverters 14, 16, 18 summed together is the duration of the one shot output pulse at terminal 24 via output inverter 22. Typically, this pulse is relatively brief, i.e. only 10 to 20 nanoseconds.

A one shot circuit of this type is not capable of delivering an output pulse of substantially longer length such as hundreds of nanoseconds or microseconds. This is because a one shot circuit delivering such an output pulse requires very large inverters 14, 16, 18, i.e. with very large powerful transistors, which is not economically feasible for large scale integrated circuit applications. Also, such a circuit would be unrealizable in a large scale integrated circuit because of noise. The noise is a result of the need to switch the inverters slowly, lengthening the time delay. The resulting very long rise and fall time render the circuit susceptible to noise.

Thus, it has not been known heretofore how to provide a one shot which is part of a large scale integrated circuit and has a long duration output pulse. The relatively long duration output pulse is desirable for many applications. A typical application of such, a one shot device in an integrated circuit chip is as an input circuit for receiving a signal from outside the chip at a chip pin and converting the input signal into a pulse of uniform length and amplitude for use by the logic circuitry in the integrated circuit. In this situation the input signal is often relatively noisy and hence contains glitches, i.e. is not a smoothly formed waveform.

SUMMARY OF THE INVENTION

In accordance with the invention, a one shot circuit includes a pull-up and a pull-down device (each being e.g. a transistor), each having a gate terminal connected to the input terminal of the one shot. The output terminals of each of the pull-up and pull-down devices are connected to a latch. The output terminal of the latch is connected to one input terminal of a combinational logic gate such as a NAND gate. The second input terminal of the NAND gate is connected to the one-shot circuit's input terminal. A capacitor is connected between ground and a node between the output terminal of the latch and the first input terminal of the NAND gate.

Further, a feedback line connects the output terminal of the NAND gate to the gate terminal of a third (depletion mode) transistor connected between the pull-up and pull-down devices.

The output terminal of the NAND gate provides an output pulse of predetermined length, the length thereof being dependent largely on the value of the capacitor.

In one embodiment, particular strength ratios between the pull-up and the pull-down devices and the depletion mode transistor optimize circuit performance.

DETAILED DESCRIPTION OF THE INVENTION

Figure 1:
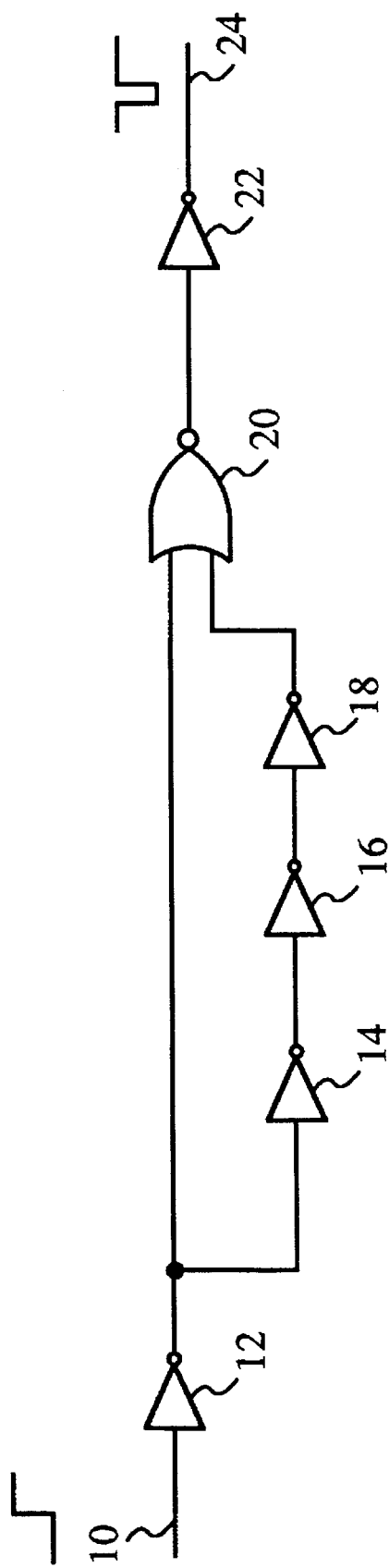
FIG. 1 shows a prior art one shot circuit.
Figure 2:
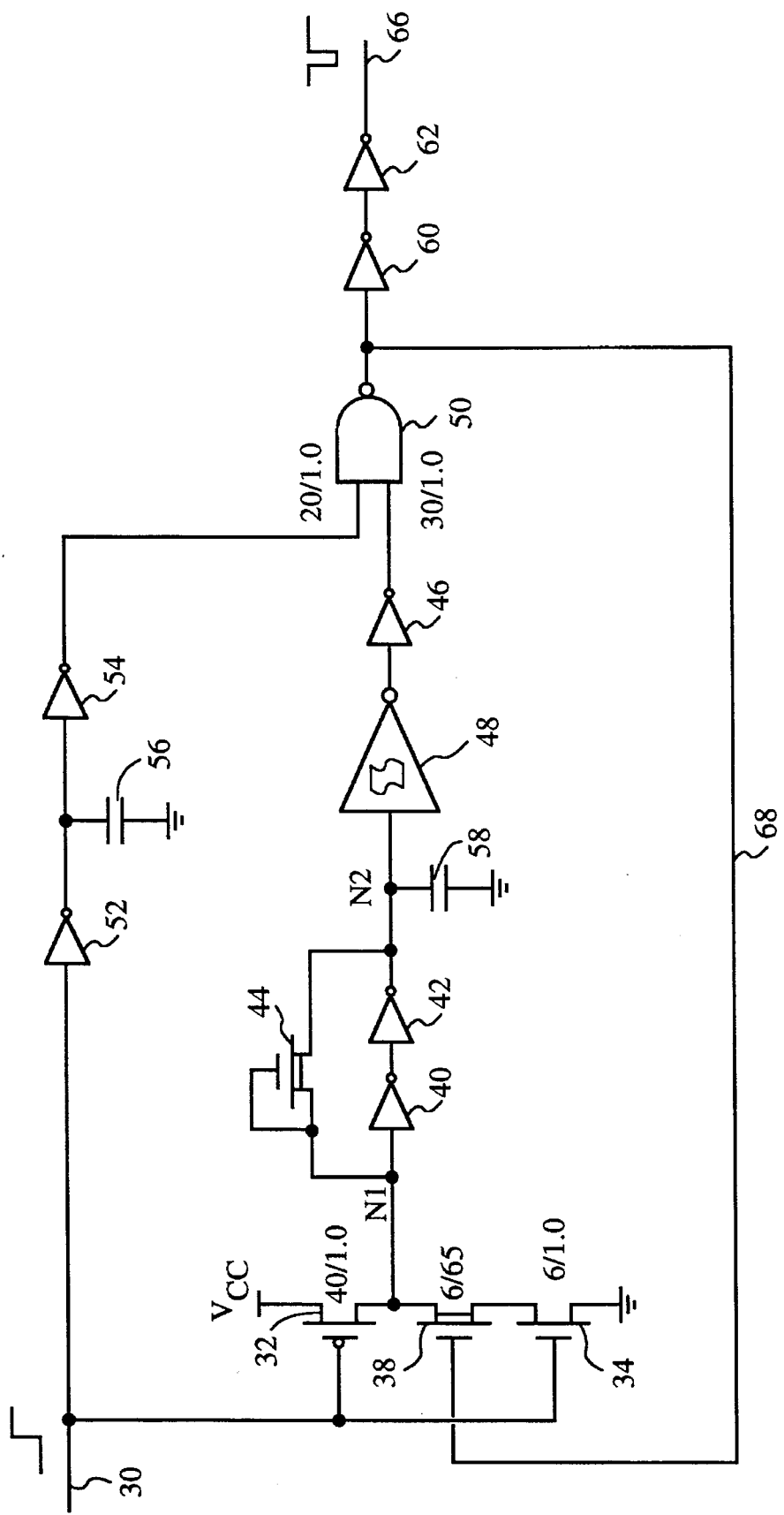
FIG. 2 shows a one shot circuit in accordance with the present invention.

FIG. 2 shows an example of a one shot circuit in accordance with the invention. The input (trigger) pulse (shown here as an upward going waveform) is provided at input terminal 30. Input terminal 30 is connected to the gate terminals of a P-channel transistor 32 (a pull-up device), and an N-channel transistor 34 (a pull-down device) both connected between voltage supply $V_{cc}$ ( e.g. 5 volts ) and ground.

As shown, in this particular embodiment the size (area) of the gate electrodes of transistors 32 and 34 is respectively 40 microns wide and 1.0 microns long, and 6 microns wide and 1.0 microns long. More importantly, it is the relative size of the transistors that matters; here the P channel transistor 32 is about 7 times the size of the N channel transistor 34. Thus the area of the gate electrode of transistor 32 is 40 square microns and the area of transistor 34 is 6 square microns. (Transistor gate electrode area is well known to be an indication of the relative strength i.e., current driving capacity, of a transistor.)

Connected between transistors 32 and 34 is an N-channel depletion mode transistor 38 having a gate electrode width of 6 microns and length of 65 microns. At a node between transistor 32 and depletion mode transistor 38, conventional inverters 40 and 42 are serially connected. Each inverter 40, 42 includes conventionally an N-channel and a P-channel transistor.

Connected in parallel to (across) inverters 40 and 42 is an additional N-channel depletion mode transistor 44, the gate terminal of which is shorted to either the source or drain terminal thereof. Elements 40, 42, 44 form a latch. The latch circuit including inverters 40, 42 and depletion mode transistor 44 generates a cleanly switching output signal at node N2 in the event that the signal at node N1 (the input to inverter 40) experiences noise. Depletion mode transistor 44 prevents a race condition between the input signal at inverter 40 and the output signal at inverter 42. One terminal of a second capacitor 58 is connected to node N2 between inverter 42 and Schmitt trigger 48. The sizes of transistors in inverters 40 and 42 determine the discharge rate of capacitor 58 at node N2.

A Schmitt trigger 48 is connected to the output terminal of the second inverter 42. It is to be understood that an inverter or other similar device may be substituted for Schmitt trigger 48. An additional inverter 46 is connected to the output terminal of Schmitt trigger 48. The output terminal of inverter 46 is connected to the first input terminal of NAND gate 50. The two transistors in NAND gate 50 respectively have gate electrode sizes of 20 microns by 1.0 microns, and 30 microns by 1.0 microns in this embodiment.

Also serially connected to input terminal 30 are two inverters 52 and 54 with a capacitor 56 connected to a node between them and also connected to ground. Inverters 52, 54 and capacitor 56 are a deglitcher to remove (filter) "glitches" (irregularities) from the input signal at terminal 30. The deglitcher shown including elements 52, 54, 56 will remove disturbances on the output signal, in one embodiment up to 10 nanoseconds in terms of glitch duration.

Also provided are two output inverters 60 and 62 connected to the output terminal of NAND gate 50. The output terminal of inverter 62 is connected to the output terminal 66 of the one shot, at which the one shot output pulse is provided as shown in a waveform.

Feedback line 68 connects the output terminal of NAND gate 50 to the gate terminal of depletion mode transistor 38.

In one embodiment, capacitors 56 and 58 are each a field effect transistor having its source and drain terminals shorted together and also connected to ground, and with the gate terminal connected to e.g., the signal carrying line. In one embodiment capacitor 58 is such a transistor having a gate electrode area of approximately 900 square microns (300 microns wide and 3 microns long), while capacitor 56 is such a transistor having a gate electrode area of approximately 50 square microns (10 microns wide and 5 microns long). These gate electrode areas correspond to the effective capacitance value and the length of the one shot signal that is needed.

It is to be understood that other types of latch circuits may be substituted for the combination of inverters 40, 42 and depletion mode transistor 44. Also, an inverter may be substituted for Schmitt trigger 48. Elements which might be dispensed with in other embodiments are, for instance, output inverters 60 and 62 and the deglitcher.

For the circuit of FIG. 2, the output pulse width at output terminal 66 has a duration of approximately 1 microsecond. To achieve other output pulse widths, one changes the capacitance of capacitor 58. The higher the capacitance of capacitor 58, the longer the output pulse width. Thus in accordance with the invention one may provide an output pulse width of from, e.g. 10 nanoseconds up to 1 millisecond. Thus advantageously a relatively long output pulse width may be provided using conventional integrated circuit fabrication technology.

The Schmitt trigger 48 removes noise from the signal path. The substitution of an inverter or equivalent for the Schmitt trigger will provide less noise reducing effects, but still will provide a useful output signal. A conventional Schmitt trigger may be used for element 48; alternatively one may use a particular Schmitt trigger as in copending and commonly owned U.S. patent application, Ser. No. 08/229, 977, invented by Sholeh Diba entitled "Low Noise Margin Schmitt Trigger with Controllable Trip Point", incorporated by reference.

With regard to the relative sizes of transistors 32, 38 and 34, the exemplary relative sizes shown in FIG. 2 advantageously provide a "clean" output signal. It has been found that one may alter these relative sizes; however, the particular ratio of sizes as shown has been found to be advantageous.

Fabrication of this one shot circuit in the integrated circuit context is conventional using CMOS technology. Alternatively, such a circuit may be assembled from discrete components, or using other semiconductor fabrication techniques.

This description is illustrative and not limiting; further modifications will be apparent to one skilled in the art and are intended to be covered by the appended claims.

I claim:

1. A one shot circuit comprising:

an input terminal;

a logic gate having a first logic gate input terminal connected to the input terminal thereby providing an unlatched signal from the input terminal to the logic gate;

a pull-up device and a pull-down device each connected to the input terminal;

a latch having an input terminal connected to the pull-up device and having an output terminal connected, by a buffering device, to a second logic gate input terminal of the logic gate thereby holding an output signal of the pull-up device; and a capacitor connected to the output terminal of the latch; wherein a one-shot output signal is provided at an output terminal of the logic gate.

2. The circuit of claim 1, further comprising:

an N-channel depletion device connected between said pull-up device and said pull-down device; and a feedback line connected from an output terminal of the logic gate to gate of the N-channel depletion device.

3. The circuit of claim 1, further comprising a deglitcher serially connected between the input terminal and the first logic gate input terminal thereby to filter irregularities from a signal applied to the input terminal.

4. The circuit of claim 3, wherein the deglitcher includes:

two serially connected inverters; and a capacitor having one terminal connected to a node between the two inverters.

5. The circuit of claim 1, wherein the buffering device includes a Schmitt trigger.

6. The circuit of claim 1, further comprising two inverters serially connected to the output terminal of the logic gate.

7. The circuit of claim 2, wherein a size of the pull-up device is about seven times a size of the pull-down device.

8. The circuit of claim 2, wherein a size of the N-channel depletion device is 65 times a size of the pull-down device.

9. A method of operating a one shot circuit comprising the steps of:

providing an input signal;

latching complement of the input signal to generate a latched signal;

logically combining the input signal and the latched complement signal to form an output signal, the logical combination being a one-shot response to the input signal.

10. The method of claim 9, further comprising the step of:

generating a delayed response to the output signal which causes the latched complement signal to switch more slowly.

11. The method of claim 9, further comprising the step of:

setting a predetermined length of the output signal in the step of logically combining, by electrically storing a portion of the latched complement signal.

12. A one shot circuit, comprising:

an input terminal;

a logic gate having a first logic gate input terminal connected to the input terminal;

a pull-up device and a pull-down device each connected to the input terminal;

a latch having an input terminal connected to the pull-up device and having an output terminal connected, by a buffering device, to a second logic gate input terminal of the logic gate, thereby holding an output signal of the pull-up device;

a capacitor connected to the output terminal of the latch; and a deglitcher serially connected between the input terminal and the first logic gate input terminal, thereby to filter irregularities from a signal applied to the input terminal, wherein the deglitcher includes:
two serially connected inverters; and
a capacitor having one terminal connected to a node between the two inverters.

13. A one shot circuit comprising:

an input terminal;

a logic gate having a first logic gate input terminal connected to the input terminal;

a pull-up device and a pull-down device each connected to the input terminal;

a latch having an input terminal connected to the pull-up device and having an output terminal connected, by a buffering device including a Schmitt trigger, to a second logic gate input terminal of the logic gate, thereby holding an output signal of the pull-up device; and a capacitor connected to the output terminal of the latch.

* * * * *